US012805416B2

(12) United States Patent
Taylor

(10) Patent No.: US 12,805,416 B2
(45) Date of Patent: Nov. 17, 2026

(54) VOLTAGE-ISOLATED INTEGRATED CIRCUIT PACKAGES WITH BACK-SIDE TRANSFORMERS

(71) Applicant: Allegro MicroSystems, LLC, Manchester, NH (US)

(72) Inventor: William P. Taylor, Amherst, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 699 days.

(21) Appl. No.: 18/300,711

(22) Filed: Apr. 14, 2023

(65) Prior Publication Data

US 2024/0347473 A1 Oct. 17, 2024

(51) Int. Cl.

| | |
|---|---|
| ***H10W 90/00*** | (2026.01) |
| ***H01F 19/08*** | (2006.01) |
| ***H01F 27/24*** | (2006.01) |
| ***H01F 27/28*** | (2006.01) |
| ***H10N 59/00*** | (2026.01) |
| ***H10W 74/10*** | (2026.01) |

(52) U.S. Cl.

CPC .......... *H10W 90/811* (2026.01); *H01F 27/24* (2013.01); *H01F 27/28* (2013.01); *H10N 59/00* (2023.02); *H10W 74/111* (2026.01); *H01F 2019/085* (2013.01); *H10W 90/756* (2026.01)

(58) Field of Classification Search

CPC . H10N 59/00; H01F 2019/085; H10W 90/811

See application file for complete search history.

(56) References Cited

U.S. PATENT DOCUMENTS

| | | | |
|---|---|---|---|
| 3,940,528 | A | 2/1976 | Roberts |
| 4,461,966 | A | 7/1984 | Hebenstreit |
| 4,748,351 | A | 5/1988 | Barzegar |
| 4,970,420 | A | 11/1990 | Billings |
| 5,019,719 | A | 5/1991 | King |
| 5,051,609 | A | 9/1991 | Smith |

(Continued)

FOREIGN PATENT DOCUMENTS

| | | | |
|---|---|---|---|
| DE | 3700488 | A1 | 7/1988 |
| DE | 10 2004 033 125 | A1 | 2/2006 |

(Continued)

OTHER PUBLICATIONS

Extended European Search Report dated Jun. 11, 2025 for European Patent Application No. 24197714.9; 19 pages.

(Continued)

*Primary Examiner* — Amar Movva

(74) *Attorney, Agent, or Firm* — DALY, CROWLEY, MOFFORD & DURKEE, LLP

(57) ABSTRACT

Aspects of the present disclosure include systems, structures, circuits, and methods providing integrated circuit (chip) packages or modules having a transformer that is disposed or mounted on or to a side of the lead frame opposite to the related semiconductor dies of the chip package. The transformer may be placed on a PCB structure. In some examples, an insulating coating may be placed on the package to increase the isolation capability of the final package. The packages and modules may include various types of circuits; in some examples, chip packages or modules may include a galvanically isolated gate driver or other high voltage circuit.

32 Claims, 6 Drawing Sheets

(56) References Cited

U.S. PATENT DOCUMENTS

| | | | | |
|---|---|---|---|---|
| 5,422,435 | A | 6/1995 | Takiar et al. | |
| 5,430,613 | A | 7/1995 | Hastings et al. | |
| 5,598,135 | A | 1/1997 | Maeda et al. | |
| 5,847,631 | A | 12/1998 | Taylor et al. | |
| 5,959,846 | A | 9/1999 | Noguchi et al. | |
| 6,107,860 | A * | 8/2000 | Vinciarelli ........... | H03K 17/691 327/434 |
| 6,181,130 | B1 | 1/2001 | Hoshi et al. | |
| 6,281,560 | B1 | 8/2001 | Allen et al. | |
| 6,329,221 | B1 | 12/2001 | King | |
| 6,377,155 | B1 | 4/2002 | Allen et al. | |
| 6,656,767 | B1 | 12/2003 | King et al. | |
| 6,775,901 | B1 | 8/2004 | Lee et al. | |
| 6,791,851 | B2 | 9/2004 | Brkovic | |
| 7,023,315 | B2 | 4/2006 | Yeo et al. | |
| 7,119,448 | B1 | 10/2006 | de Stasi | |
| 7,173,835 | B1 | 2/2007 | Yang | |
| 7,663,351 | B2 | 2/2010 | Korsunsky | |
| 7,719,112 | B2 | 5/2010 | Shen | |
| 7,804,697 | B2 | 9/2010 | Melanson | |
| 7,868,431 | B2 | 1/2011 | Feng et al. | |
| 8,063,689 | B2 | 11/2011 | Theiler | |
| 8,094,458 | B2 | 1/2012 | Furnival | |
| 8,217,748 | B2 | 7/2012 | Feng et al. | |
| 8,680,837 | B2 | 3/2014 | Zeng et al. | |
| 8,736,343 | B2 | 5/2014 | Chen et al. | |
| 8,816,666 | B2 | 8/2014 | Kimura et al. | |
| 9,048,020 | B2 | 6/2015 | Calvillo Cortes et al. | |
| 9,190,606 | B2 | 11/2015 | Liu et al. | |
| 9,660,584 | B2 | 5/2017 | Modi et al. | |
| 9,743,523 | B2 | 8/2017 | Huang et al. | |
| 9,847,166 | B2 | 12/2017 | Kneller | |
| 9,865,807 | B2 | 1/2018 | Liu et al. | |
| 9,887,034 | B2 | 2/2018 | Francis | |
| 9,899,140 | B2 | 2/2018 | Kneller et al. | |
| 9,922,764 | B2 | 3/2018 | Kneller et al. | |
| 9,948,294 | B2 | 4/2018 | Peter et al. | |
| 10,002,703 | B2 | 6/2018 | Wang et al. | |
| 10,014,798 | B1 | 7/2018 | Vinciarelli | |
| 10,062,495 | B2 | 8/2018 | Lloyd | |
| 10,176,917 | B2 | 1/2019 | Parish et al. | |
| 10,217,558 | B2 | 2/2019 | Kneller | |
| 10,224,143 | B2 | 3/2019 | Kneller et al. | |
| 10,229,779 | B2 | 3/2019 | Harber | |
| 10,234,513 | B2 | 3/2019 | Vig et al. | |
| 10,256,027 | B2 | 4/2019 | Li et al. | |
| 10,319,509 | B2 | 6/2019 | Kneller et al. | |
| 10,347,413 | B2 | 7/2019 | Francis | |
| 10,573,457 | B2 | 2/2020 | Wang et al. | |
| 10,811,181 | B2 | 10/2020 | Parish et al. | |
| 10,930,422 | B2 | 2/2021 | Francis | |
| 11,139,102 | B2 | 10/2021 | Kneller et al. | |
| 11,201,619 | B2 | 12/2021 | Rinne et al. | |
| 11,211,929 | B2 | 12/2021 | Rinne et al. | |
| 11,282,631 | B2 | 3/2022 | Francis | |
| 2002/0142515 | A1 | 10/2002 | Wehrly, Jr. | |
| 2007/0158802 | A1 | 7/2007 | Wehrly, Jr. | |
| 2007/0228545 | A1 | 10/2007 | Ramakrishna et al. | |
| 2009/0147544 | A1 | 6/2009 | Melanson | |
| 2009/0237899 | A1 | 9/2009 | Furnival | |
| 2012/0008344 | A1 | 1/2012 | Zeng et al. | |
| 2012/0206171 | A1 | 8/2012 | Kimura et al. | |
| 2013/0020695 | A1 | 1/2013 | Na et al. | |
| 2013/0293268 | A1 | 11/2013 | Draxelmayr et al. | |
| 2015/0187738 | A1 | 7/2015 | Tan | |
| 2015/0214200 | A1 | 7/2015 | Tan et al. | |
| 2015/0348882 | A1 | 12/2015 | Yeo | |
| 2016/0181004 | A1 | 6/2016 | Li et al. | |
| 2017/0352633 | A1 | 12/2017 | Mariottini et al. | |
| 2019/0109233 | A1 | 4/2019 | Tellkamp et al. | |
| 2021/0376822 | A1 | 12/2021 | Thompson et al. | |
| 2022/0028593 | A1* | 1/2022 | Tang .................. | H01F 17/0006 |
| 2022/0084971 | A1 | 3/2022 | Lee | |
| 2022/0116036 | A1 | 4/2022 | Rinne et al. | |

FOREIGN PATENT DOCUMENTS

| | | | |
|---|---|---|---|
| EP | 2 320 458 | A1 | 5/2011 |
| EP | 4 148 782 | A2 | 3/2023 |
| GB | 2 250 383 | A | 6/1992 |
| GB | 2 341 288 | A | 3/2000 |
| JP | H01300617 | A | 12/1989 |
| JP | 2001 167941 | A | 6/2001 |
| JP | 2003 234234 | A | 8/2003 |
| JP | 2008 072021 | A | 3/2008 |
| WO | WO 93/21690 | | 10/1993 |
| WO | WO 95/12247 | | 5/1995 |
| WO | WO 2009/008739 | A1 | 1/2009 |
| WO | WO 2010/061281 | A2 | 6/2010 |
| WO | WO 2011/137845 | A1 | 11/2011 |
| WO | WO 2021/211920 | A1 | 10/2021 |

OTHER PUBLICATIONS

European Search Report dated Feb. 5, 2025, for European Patent Application No. EP24197714.9; 18 pages.
Bourgeois, "An Isolated Gate 25 Drive for Power MOSFETs and IGBTs", STMicroelectronics Group, AN461/0194, 1999; 7 pages.
"ADuM4135 Data Sheet, Single-/Dual-Supply, High Voltage Isolated IGBT Gate Driver with Miller Clamp", Analog Devices Inc., Rev. E, 2015; 17 pages.
"Si827x", Datasheet Rev. 0.5, Silicon Laboratories Inc., 2016; 43 pages.
U.S. Appl. No. 18/495,060, filed Oct. 26, 2023, Mangtani et al.
U.S. Appl. No. 19/083,970, filed Mar. 19, 2025, Mangtani et al.
International Search Report and Written Opinion dated Jun. 6, 2024, for International Application No. PCT/US2024/016825; 12 pages.
Response to Rules 161/162 Notice dated Sep. 30, 2025 and to Written Opinion dated Jun. 6, 2024 for European Application No. 24714643.4; Response Filed Feb. 19, 2026; 21 Pages.
U.S. Non-Final Office Action dated Mar. 27, 2026 for U.S. Appl. No. 18/495,060; 19 Pages.
Response to Non-Final Office Action dated Mar. 27, 2026 for U.S. Appl. No. 18/495,060, filed May 29, 2026; 19 Pages.
Response to Final Office Action dated Apr. 27, 2026 for U.S. Appl. No. 18/450,494, filed Jun. 9, 2026; 14 Pages.
Final Office Action dated Jul. 21, 2026, for U.S. Appl. No. 18/495,060. 22 Pages.

* cited by examiner

VOLTAGE-ISOLATED INTEGRATED CIRCUIT PACKAGES WITH BACK-SIDE TRANSFORMERS

BACKGROUND

Solid state switches typically include a transistor structure and are usually either turned on completely or turned off completely. The controlling electrode of the switch, usually referred to as its gate (or base), is typically controlled (driven) by a switch drive circuit, sometimes also referred to as gate drive circuit. Such solid state switches are typically voltage-controlled, turning on when the gate voltage exceeds a manufacturer-specific threshold voltage by a margin, and turning off when the gate voltage remains below the threshold voltage by a margin.

Switch drive circuits typically receive their control instructions from a controller such as a pulse-width-modulated (PWM) controller via one or more switch driver inputs. Switch drive circuits deliver their drive signals directly (or indirectly via networks of active and passive components) to the respective terminals of the switch (gate and source).

Some electronic systems, including ones with solid state switches, have employed galvanic isolation to prevent undesirable DC currents flowing from one side of an isolation barrier to the other. Such galvanic isolation can be used to separate circuits in order to protect users from coming into direct contact with hazardous voltages.

Various transmission techniques are available for signals to be sent across galvanic isolation barriers including optical, capacitive, and magnetic coupling techniques. Magnetic coupling typically relies on use of a transformer to magnetically couple circuits on the different sides of the transformer, typically referred to as the primary and secondary sides, while also providing galvanic separation of the circuits.

Transformers used for magnetic coupling isolation barriers typically utilize a magnetic core to provide a magnetic path to channel flux created by the currents flowing in the primary and secondary sides of the transformer. Magnetic-coupling isolation barriers have been shown to have various drawbacks, including manufacturing problems, for integrated circuit (IC) packages due to the included magnetic core.

SUMMARY

An aspect of the present disclosure includes chip packages for galvanically isolated integrated circuits (ICs). A chip package can include a lead frame with first and second sides; first and second semiconductor dies (a.k.a. IC dies) may be disposed on a first side of the lead frame; a molding material can be configured to cover a portion of the lead frame, forming a package body; a ferromagnetic core can be disposed in the package body adjacent a second side of the lead frame; and first and second coils can be disposed in the package body, configured about the ferromagnetic core in a transformer configuration, each coil including a plurality of windings; where the first and second coils and ferromagnetic core are disposed within the package body on the second side of the lead frame, opposite to the first side.

Implementations may include one or more of the following features. The chip package may include first and second die conductive portions configured to receive/support the first and second dies (which may be referred to as die pads or die paddles), where the first and second semiconductor dies are disposed on the first and second die pads, respectively. The first and/or second die may include an integrated circuit (IC). The integrated circuit may include a gate driver circuit. The chip package may include an insulator material disposed between the first and second coils.

One general aspect includes a chip package including: a lead frame with first and second sides and configured to receive first and second semiconductor dies on the first side; a package body including molding material and configured to cover a portion the lead frame; a transformer core disposed in the package body on the second side of the lead frame; and first and second coils having windings disposed about the transformer core in a transformer configuration and disposed in the package body; where the first and second coils and transformer core can be disposed on the second side of the lead frame, opposite to the first side.

Implementations may include one or more of the following features. The chip package may include first and second semiconductor dies disposed on the first side of the lead frame. The first and second coils can be configured to magnetically couple the first and second semiconductor dies. The first and second semiconductor dies may include first and second integrated circuits (ICs), respectively. The first or second integrated circuit (IC) may include a gate driver. The gate driver can be configured to receive power from the transformer. The gate driver can be configured to receive control signals from the transformer. The first or second integrated circuit may include a gate driver. The chip package may include first and second die pads disposed on the first side of the lead frame and configured to receive/support the first and second semiconductor dies, respectively. The chip package may include a first plurality of wire bonds connecting the lead frame to the first semiconductor die. The chip package may include a second plurality of wire bonds connecting the lead frame to the second semiconductor die. A shortest distance between the first and second pluralities of wire bonds may be at least 1 mm. A shortest distance between the first and second pluralities of wire bonds may be at least 1.2 mm. A shortest distance between the first and second pluralities of wire bonds may be at least 1.5 mm. A shortest distance between the first and second pluralities of wire bonds may be at least 3 mm. A shortest distance between the first and second pluralities of wire bonds may be at least 5.5 mm. A shortest distance between the first and second pluralities of wire bonds may be at least 7.2 mm. A shortest distance between the first and second pluralities of wire bonds may be at least 8 mm. The lead frame may include a partially etched lead frame portion/region. A shortest distance between the lead frame and a conductive portion of the transformer may be at least 1 mm. A shortest distance between the lead frame and a conductive portion of the transformer may be at least 1.2 mm. A shortest distance between first and second conductive portions of the lead frame may be at least 1.5 mm. A shortest distance between first and second conductive portions of the lead frame may be at least 3 mm. A shortest distance between first and second conductive portions of the lead frame may be at least 5.5 mm. A shortest distance between first and second conductive portions of the lead frame may be at least 7.2 mm. A shortest distance between first and second conductive portions of the lead frame may be at least 8 mm.

Another general aspect of the present disclosure includes a method of making a galvanically-isolated (voltage-isolated) integrated circuit (IC) package. The method can include: providing a lead frame having first and second sides and configured to receive first and second semiconductor dies; connecting first and second semiconductor dies to a first side of the lead frame; disposing a transformer core on the second side of the lead frame; providing first and second coils disposed about the transformer core; and, forming a package body covering the first and second semiconductor dies and the first and second coils disposed on the transformer core.

Implementations may include one or more of the following features. Forming a package body may include applying molding material to cover the first and second semiconductor dies. Applying molding material to cover the first and second semiconductor dies may include a first molding step and may include applying molding material as a second molding step to cover the first and second coils disposed on the transformer core. Forming a package body may include applying molding material to cover the first and second coils disposed on the transformer core. The lead frame may include first and second die pads configured to receive the first and second semiconductor dies, respectively. The first and/or second semiconductor die may include a gate driver for a solid state device. The solid state device may include a solid state power device/switch. The solid state power device/switch may include a MOSFET, a GaNFET, a SiCFET, an IGBT, and/or the like. The first and second coils can be disposed about the transformer core and configured as a transformer magnetically coupling the first and second semiconductor dies while providing galvanic separation between the semiconductor dies and any integrated circuits (ICs) included in either or both of the dies.

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the present disclosure, which is susceptible of many embodiments. What follows is illustrative, but not exhaustive, of the scope of the present disclosure.

BRIEF DESCRIPTION OF THE DRAWINGS

The manner and process of making and using the disclosed embodiments may be appreciated by reference to the figures of the accompanying drawings. In the figures like reference characters refer to like components, parts, elements, or steps/actions; however, similar components, parts, elements, and steps/actions may be referenced by different reference characters in different figures. It should be appreciated that the components and structures illustrated in the figures are not necessarily to scale, emphasis instead being placed upon illustrating the principals of the concepts described herein. Furthermore, embodiments are illustrated by way of example and not limitation in the figures, in which.

DETAILED DESCRIPTION

Figure 1A:
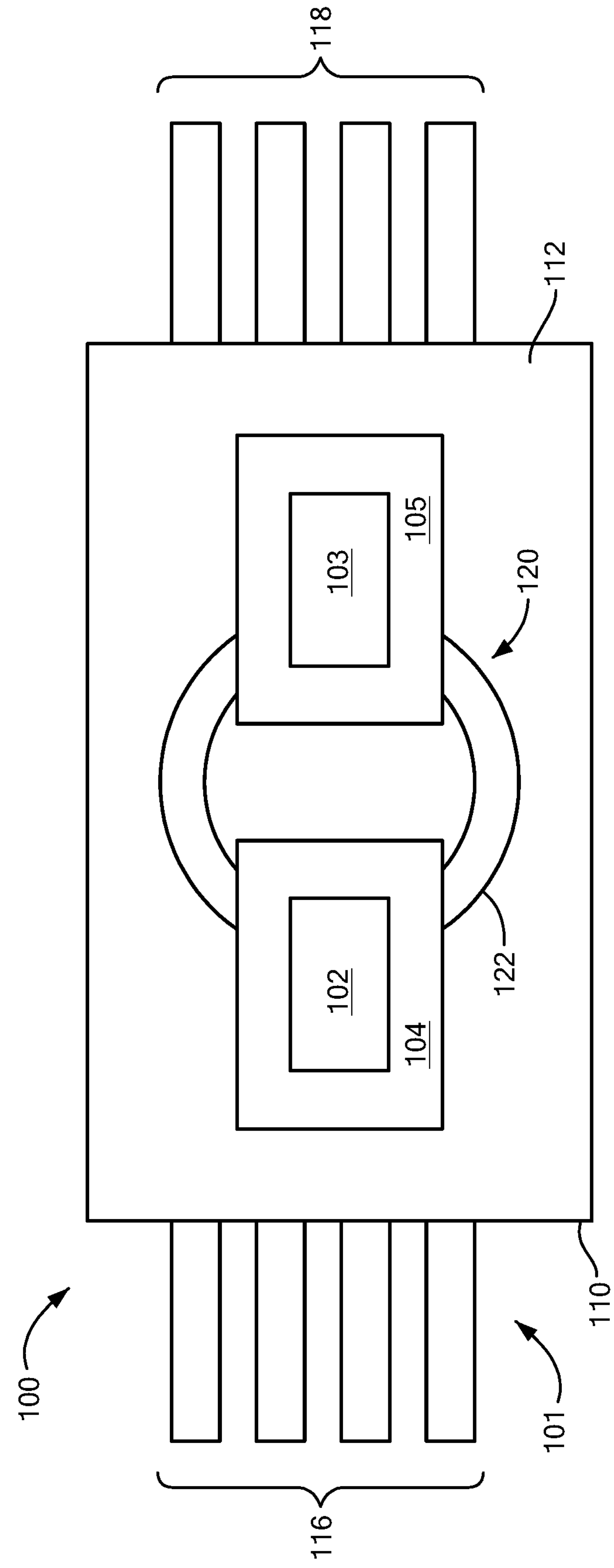
FIG. 1A is a diagram showing a top view of an example voltage-isolated integrated circuit package with backside transformer, in accordance with the present disclosure.

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter. The subject technology is susceptible of many embodiments. What follows is illustrative, but not exhaustive, of the scope of the subject technology.

Aspects of the present disclosure are directed to and include systems, structures, circuits, and methods providing integrated circuit (IC) packages or modules with a voltage-isolation transformer implemented on a lead frame on an opposite side with respect to the associated ICs. The IC packages and modules may include various types of circuits; in some examples, IC packages or modules may include a galvanically isolated gate driver or other high voltage circuit, etc. First and second semiconductor dies having one or more integrated circuits (a.k.a., "IC dies") can be included in the packages. Such integrated circuits can include, e.g., but are not limited to, high-voltage circuits such as galvanically-isolated gate drivers configured to drive an external gate on a solid-state switch, e.g., a MOSFET, GaNFET, SiCFET, an IGBT, or another load. The windings may be composed of or include a combination of preformed metal parts (e.g., lead frames, etc.), held by suitable insulation material, for example, molding and/or potting compound. In some examples/embodiments, the transformer can be or include a printed circuit board (PCB) with metal vias and wire bonds over a core. In some examples/embodiments, the windings may be or include a combination of PCB traces and vias with or without a top connection (portion of a winding) being a wire bond; in other examples/embodiments, the top connection (portion of a coil) can be made by PCB like techniques and include PCB structures, e.g., vias, traces, etc.

In some examples, the lead frame(s) and/or circuit board (s) may have additional polymer or insulation layers, e.g., to comply with given isolation requirements. In some examples, a printed circuit board (PCB) may be replaced with a substrate, e.g., an alumina substrate. In examples, primary and secondary (a.k.a., first and second sides) of the transformer windings may be on opposite sides of the PCB or alumina substrate to increase the voltage isolation. In some examples, wire bonds may be used to connect the windings to the die. In some examples, a die or dies (dice) may be flip-chip connected to a lead frame, circuit board, e.g., alumina or PCB, or flex substrates such as polyimide or polyamide as examples, etc. The die or the winding substrates may then be connected to the pins of the package by wire bonding or another suitable method. In some examples, solder bumps or stud bump processes can be used. If the dies are also connected to the board using a similar method, it may be preferable that the solder or bump materials are selected such that the reflow process used to connect the winding substrate with the dies to the leads does not cause the dies to fall off of the substrate.

In some examples, a final package or module can be coated with an insulator, or a tape material could be added to the module or package to hold the core in place. A second mold (or third if the core is molded) of insulating material can also be used to secure the core and/or provide increased distance between first and second sides of the IC in the package, e.g., high and low sides of the package. If a second or third mold is used, locking features may be made (formed) in the first mold to help secure the second mold (or third mold).

FIG. 1A is a diagram showing a top view of an example galvanically-isolated (voltage-isolated) integrated circuit (chip) package 100 with backside transformer, in accordance with the present disclosure. Lead frame 101 includes regions or areas, e.g., 104 and 105, with conductive material which may also be referred to as die pads or paddles. First and second semiconductor dies 102 and 103 may be included in package 100, e.g., mounted directly or indirectly on die pads 104 and 105, respectively. Package 100 includes a body 110, which may be formed of or include an insulating and/or protective material 112, e.g., mold material, such as an epoxy mold material. Body 110 can include transformer 120 including core 122 and first and second coils (shown in FIG. 1B). Lead frame 101 may include first and second sets of leads (lead sets) 116 and 118, each including a plurality of leads protruding from package body 110. In some examples, chip package (module) 100 may include or house, e.g., an isolated gate driver, or other high voltage application/integrated circuit (IC). In some examples, core 122 may include a high magnetic permeability material, e.g., ferrite. In the diagram, mold or insulating material is shown removed for visibility of structure interior to package body 110.

As noted, package 100 can include a transformer 120. Transformer 120 can include a core 122, e.g., a ferromagnetic core, and multiple coils (shown as 124, 126 in FIG. 1B). Core 122 may have any suitable shape, e.g., toroidal (as shown), rectangular, etc. The coils can be configured about the core 122 (e.g., with coil loops or windings wrapped around a portion of the core) connected to semiconductor dies 102, 103, respectively, such that in operation, the transformer 120 provides magnetic coupling of and galvanic isolation for dies 102 and 103 and/or one or more ICs included in dies 102, 103.

Figure 1B:
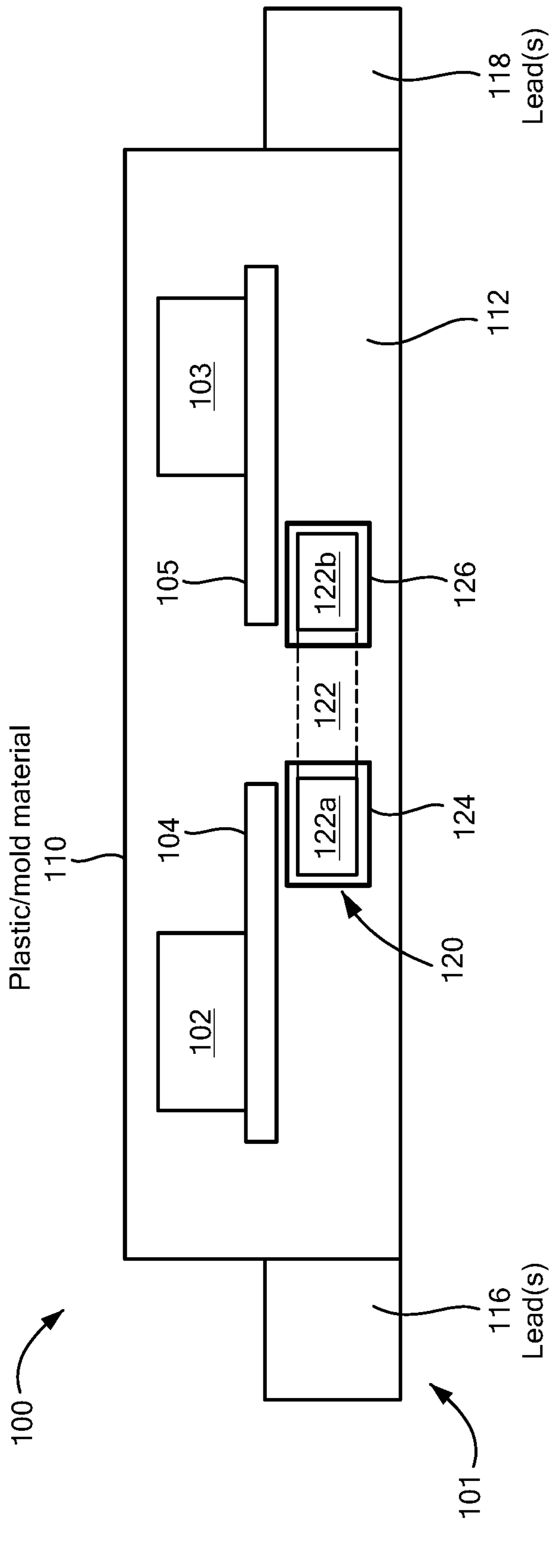
FIG. 1B is side view of the integrated circuit package of FIG. 1A.

FIG. 1B is a diagram showing a side view of the package 100 of FIG. 1. Coils 124, 126 can include electrical connections (not shown) to dies 102 and 103 and/or one or more ICs included in dies 102, 103. Core 122 is shown in section view, with cross sections 122*a*, 122*b* indicated. Coils 124, 126 are shown configured on core 122, looped around sections 122*a*, 122*b*.

Figure 2:
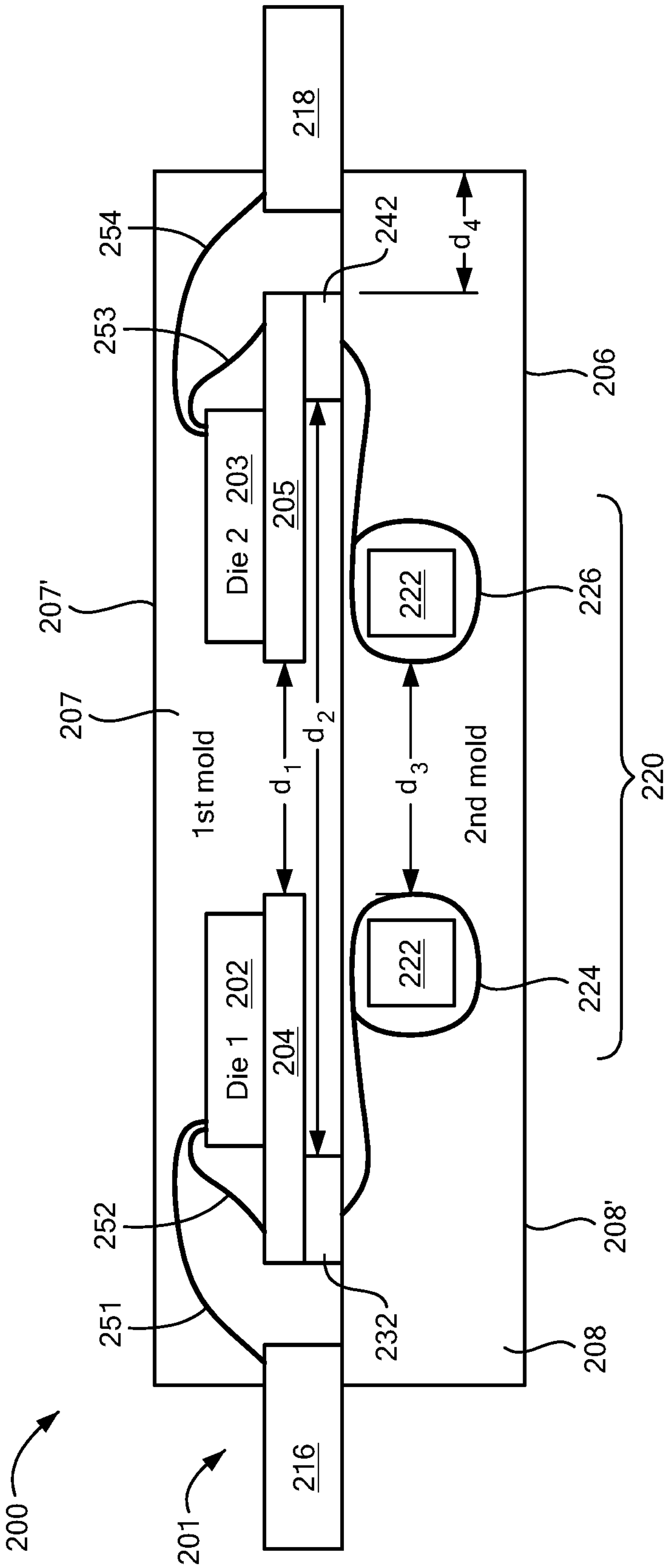
FIG. 2 is a diagram showing a side view of a further example voltage-isolated integrated circuit package with backside transformer, in accordance with the present disclosure.

FIG. 2 is a diagram showing a side view of a further example galvanically-isolated (voltage-isolated) integrated circuit (IC, a.k.a., chip) package 200 with backside transformer, in accordance with the present disclosure. Package 200 can include a lead frame 201 and first and second semiconductor dies 202, 203. Dies 202, 203 can be disposed (directly or indirectly) on die pads 204, 205—conductive portions—on one side of lead frame 201. Transformer 220, having core 222, and first and second coils 224, 226, can be disposed on or connected to the lead frame, on a side opposite IC dies 202, 203. Coils 224, 226 can each have one or more windings of conductive material (e.g., wire) configured (e.g., wrapped or wound) around a portion of core 222. Package 200 can include a main body 206 that can be composed of or include mold material, e.g., regions having first and second mold materials 207, 208 as applied by one or more mold processes, respectively. Lead frame 201 can include first and second sets of leads (lead sets) 216, 218 extending from main body 206, e.g., electrical connection to other circuits, components, and/or systems outside of package 200.

Dies 202, 203 can be connected by electrical connections, e.g., wire bonds, 251, 254 to leads 216, 218, respectively. Dies 202, 203 can also be connected to conductive portions (die pads or "paddles") 204, 205 of lead frame 201 by electrical connections, e.g., wire bonds, 252, 252. Alternatively, the dies (dice) 202, 203 may be connected to the lead frame 201 by solder bumps, copper pillars, or other electrical connections used in/for a flip-chip or flip-chip-like process. Conductive lead frame portions 204, 205 in turn can be connected to coils 224, 226 by conductive pads 232, 234, respectively, as shown. In some examples, ICs configured or disposed in dies 202, 203 can function as primary and secondary circuits, e.g., with low and high voltage levels, respectively, on different sides of the (galvanic) isolation barrier provided by transformer 220. In some examples and/or embodiments, the different sides of the (galvanic) isolation barrier provided by transformer 220 can be referred to as an input (or, primary) side and a secondary (or, output) side, respectively.

In some examples and/or embodiments, integrated circuits (ICs) in dies 202, 203, or other conductive features of the primary and secondary sides of transformer 220, in the main body 206 can be fabricated or configured to have a desired separation distance (d) between certain parts or features, e.g., to meet internal creepage or external clearance requirements for a given pollution degree rating as defined by certain safety standards bodies such as the Underwriters Laboratories (UL) and the International Electrotechnical Commission (IEC). For example, a separation distance may be between closest (voltage) points of the respective circuits, e.g., the low-voltage (primary) side and high-voltage (secondary) side. For further example, such a separation distance may be the distance between any two voltage points between the primary and secondary sides, e.g., distance $d_1$ between conductive lead frame portions (die pads or paddles) 204 and 205, or a distance between die 202 and die 203 in FIG. 2, may be at least 1.2 mm, 1.4 mm, 1.5 mm, 3.0 mm, 4.0 mm, 5.5 mm, 7.2 mm, 8.0 mm, 10 mm, or 10+ mm in respective examples. Such a distance between conductive portions of dies can include any insulation covering a conductor, e.g., such as plastic coating of a wire/lead. Other distances between parts, components, and/or features of package 200 (for example, $d_2$, $d_3$, and/or $d_4$) may also be designed and implemented, e.g., to meet desired internal voltage creepage or external clearance requirements.

As noted above, in some embodiments, package 200 can include regions having first and second mold materials 207, 208, and each may be applied by a separate (mold) molding process/step, forming respective molded packages or molds 207', 208', which together form package 200. First mold 207' (including dies 202, 203 and die paddles 204, 205) can be formed such that die paddles 204, 205 are not exposed at the edge/boundary of first mold 207', and only conductive pads 232, 234 on the back (exposed) side of mold 207' are exposed for connection to the transformer 220 included in the second molded body 208'. When the two molds 207', 208' are brought into connection (mated), transformer 220 becomes connected to dies 202, 203. The conductive pads 232, 234 may be selected/designed to have desired shapes and/or sizes, e.g., to facilitate attaining a particular separation distance. In some embodiments, conductive pads 232, 234 can be fabricated to have a desired size and shape by selective partial etching of lead frame 201.

A dielectric material (e.g., gel) may be used for potting and/or protecting PCB system assemblies, e.g., power semiconductor packages or modules, to protect dies and/or interconnects from environment conditions and/or to provide dielectric insulation. In some examples, a dielectric material may include, but is not limited to, one or more of the following materials: DOWSIL™ EG-3810 Dielectric Gel (made available by The Dow Chemical Corporation, a.k.a., "Dow", and DOWSIL™ EG-3896 Dielectric Gel (made available by Dow), which has the ability to provide isolation greater than 20 kV/mm. Other suitable gel materials may also or instead be used, e.g., to meet or facilitate meeting/achieving voltage isolation specifications required by a given package design. DOWSIL™ EG-3810 is designed for temperature ranges from −60° C. to 200° C. and DOWSIL™ EG-3896 Dielectric Gel −40° C. to +185° C.; both of which can be used to meet typical temperature ranges for automotive applications.

Figure 3:
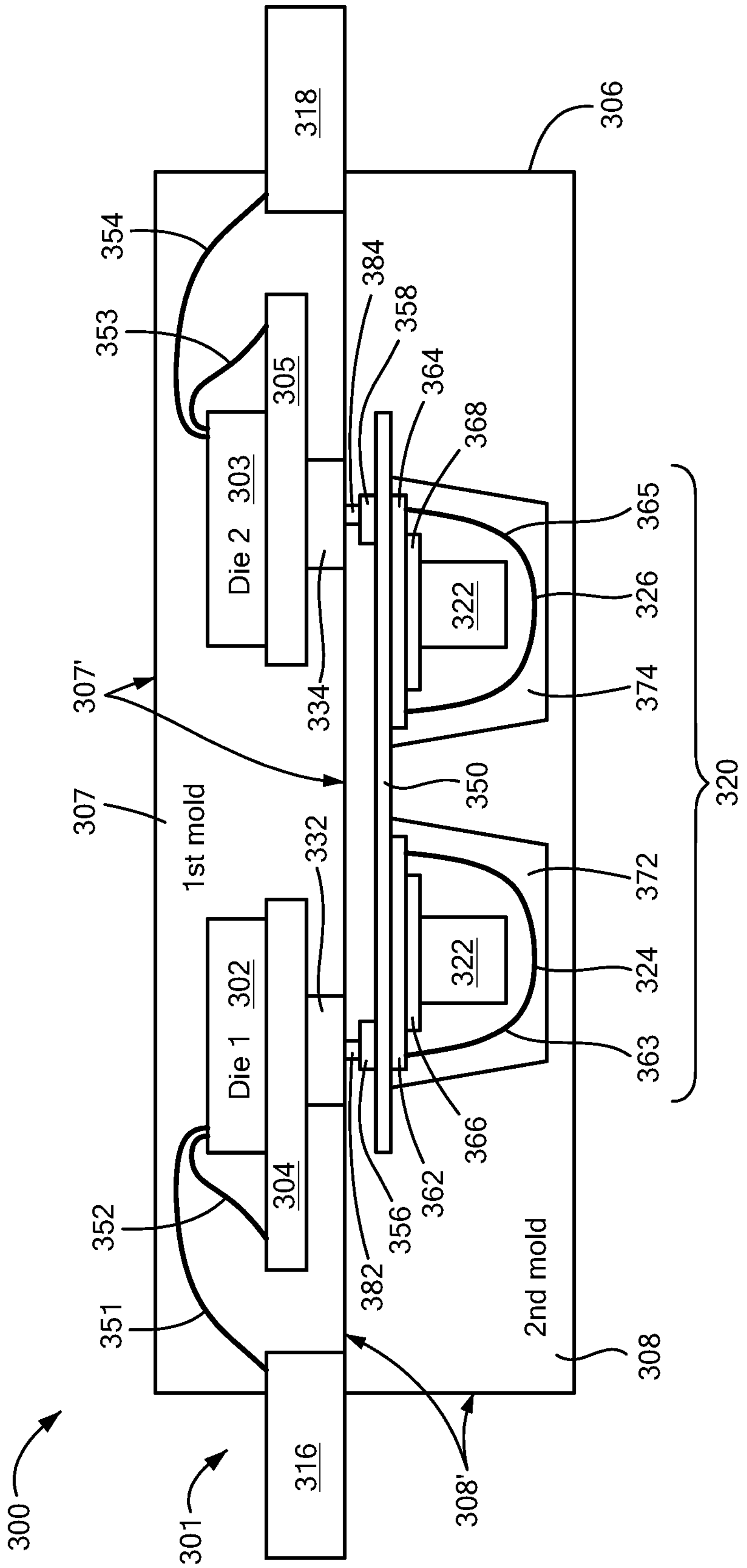
FIG. 3 is a diagram showing a side view of an example voltage-isolated integrated circuit package with backside transformer utilizing a substrate, in accordance with the present disclosure.

FIG. 3 is a diagram showing a side view of an example galvanically-isolated (voltage-isolated) integrated circuit (IC) package 300 with backside transformer utilizing a substrate, in accordance with the present disclosure. Package 300 can include a lead frame 301 and multiple integrated circuit (IC), a.k.a., semiconductor, dies 302, 303. Dies 302, 303 can be disposed (directly or indirectly) on die pads or paddles (conductive portions) 304, 305 on one side of lead frame 301. Transformer 320, having core 322, and first and second coils 324, 326, can be disposed on or connected the lead frame 301, on a side opposite dies 302, 303, as shown. Coils 324, 326 can each have one or more windings of conductive material (e.g., wire) configured around (e.g., wrapped) a portion of core 322. Package 300 can include a main body 306 that can be composed of or include mold material, e.g., regions having first and second mold materials 307, 308 as applied by one or more mold processes, respectively. Lead frame 301 can include first and second sets of leads (lead sets) 316, 318 extending from main body 306, e.g., electrical connection to other circuits, components, and/or systems outside of package 300.

As noted previously, in some embodiments, package 300 can include regions having first and second mold materials 307, 308, and each may be applied by a separate (mold) molding process/step, forming respective molded packages or molds 307', 308', which together form package 300. First mold 307' (including dies 302, 303 and die paddles 304, 305) can be formed such that die paddles 304, 305 are not exposed at the edge/boundary of first mold 307', and only conductive pads 332, 334 on the back (exposed) side of mold 307' are exposed for connection to the transformer 320 included in second molded body 308'. When the two molds 307', 308' are brought into connection (mated), transformer 320 becomes connected to dies 302, 303. The conductive pads 332, 334 may be selected/designed to have desired shapes and/or sizes, e.g., to facilitate attaining a particular separation distance. In some embodiments, conductive pads 332, 334 can be fabricated to have a desired size and shape by selective partial etching of lead frame 301.

Dies 302, 303 can be connected by electrical connections 351, 354 to leads 316, 318, respectively. Dies 302, 303 can also be connected, e.g., by wire bonds 253, 353, to conductive portions 304, 305 of lead frame 301, which in turn can be connected to coils 324, 326, respectively, by conductive structure described below for substrate 350. In some examples, ICs configured or disposed in IC dies 302, 303 can function as primary and secondary circuits, e.g., with low and high voltage levels, respectively, on different sides of the (magnetic) isolation barrier provided by transformer 320.

As shown, package 300 can include a substrate 350 to facilitate mounting or connecting transformer 320 to lead frame 301. In some examples, substrate 350 can include a printed circuit board (PCB) or an alumina substrate. Transformer core 322 can be mounted to substrate 350 using an insulating material 366, 368 (e.g., an insulating tape made of Kapton® or other polyimide material, or a non-conductive epoxy, etc.) and conductive traces/regions 362, 364, respectively. In some examples, e.g., embodiments utilizing flip-chip mounting, substrate 350 can be mounted to lead frame 301 using solder bumps (or copper pillars) 382, 384, e.g., at raised regions 332, 334 of conductive portions 304, 305 of lead frame 301. Coils 324, 326 can include (or be composed of) portions formed by conductive traces 362, 364, respectively, and other portions including (composed of) wires 363, 365, respectively. An optional dielectric gel and/or potting material 372, 374 may be used to protect and/or insulate the transformer structure(s). In other examples and embodiments, the transformer may be fabricated in the PCB or a flexible circuit substrate with no windings other than those made in the PCB or flexible substrate, e.g., as shown in FIG. 4.

Figure 4:
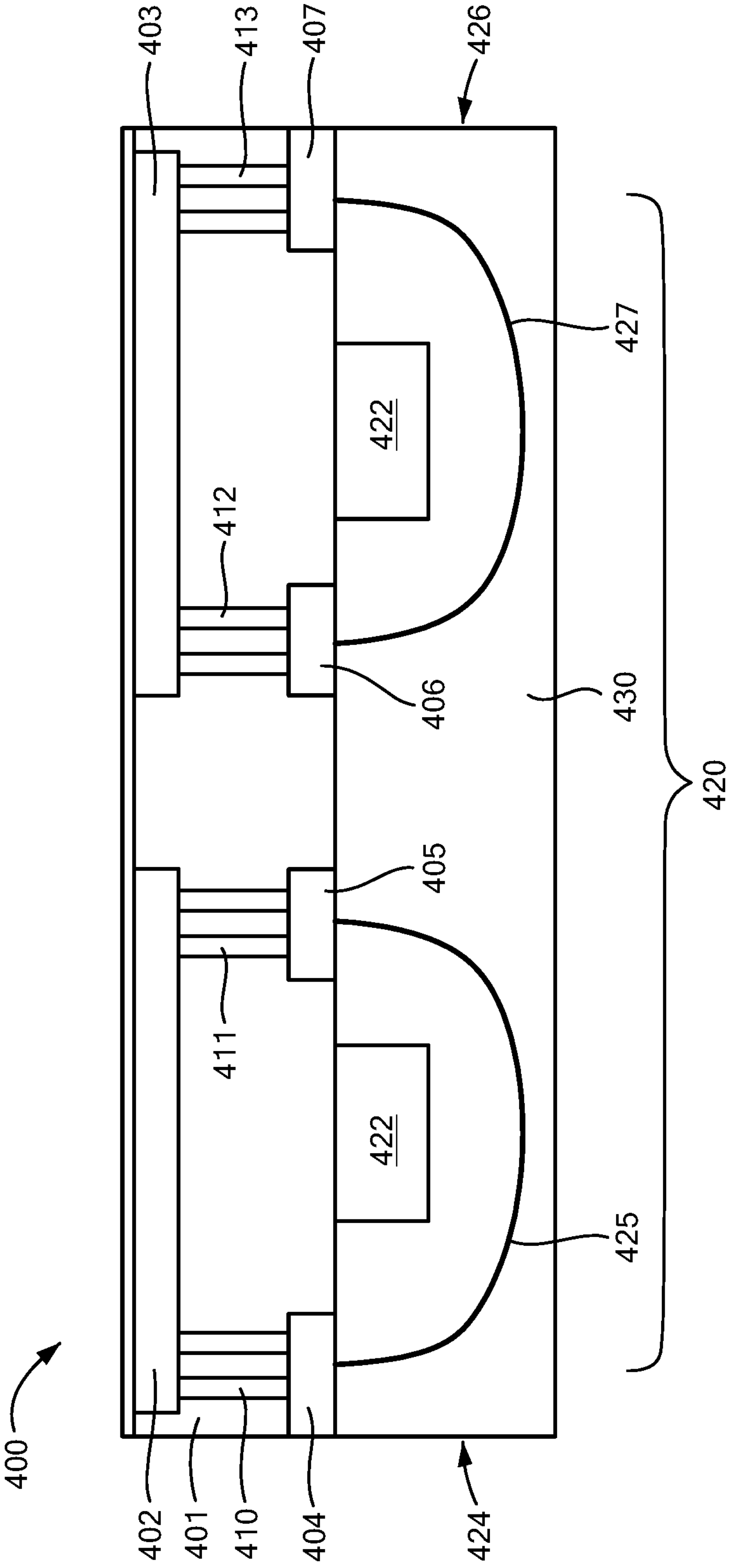
FIG. 4 is a diagram showing a side view of an example transformer and substrate structure, in accordance with the present disclosure.

FIG. 4 is a diagram showing a side view of an example transformer and substrate structure 400, in accordance with the present disclosure. Structure 400 can include substrate 401 with a transformer 420 mounted to substrate 401. Transformer 420 can include core 422 and coils 424, 426. Substrate 401 can include conductive regions or traces 402, 403 on or adjacent a first side and separate conductive regions or traces 404, 405, 406, and 407 on or adjacent a second side. Vias (e.g., conductive columns) 410, 411, 412, and 413 internal to substrate 401 can connect conductive regions/traces on different sides of substrate 401. While double (two-layer) vias are shown, other examples/embodiments can include one or more single-layer vias or vias having more than two layers.

As shown, coils 424, 426 can include or be composed of a number of components/parts. For example, coil 424 can include wire (winding) portion 425, conductive trace 404, via 410, conductive trace 402, via 411, and conductive trace 405. Similarly, coil 426 can include wire (winding) portion 427, conductive trace 406, via 412, conductive trace 403, via 413, and conductive trace 407. Accordingly, in operation of transformer 420, structure 400 can be used to provide a galvanic isolation barrier and to magnetically couple and galvanically isolate two circuits (e.g., ICs residing in dies 302, 303 in FIG. 3) connected to coils 424, 426, respectively.

Figure 5:
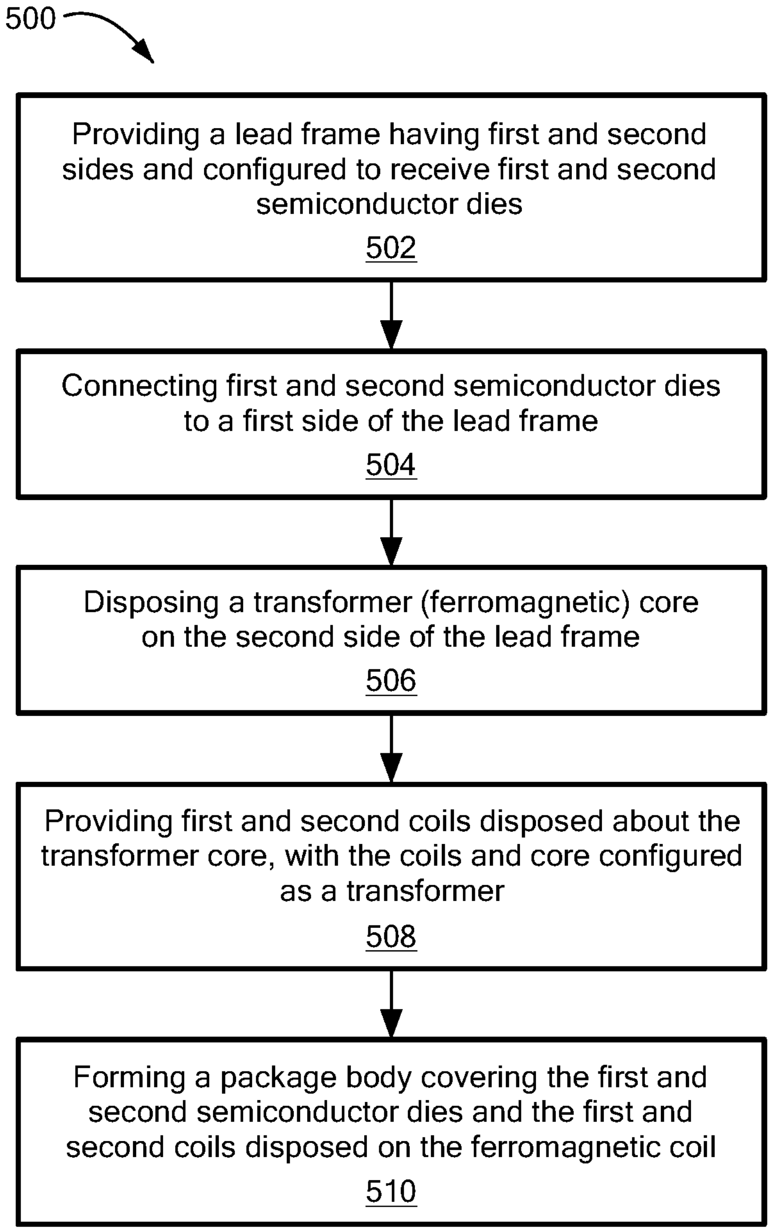
FIG. 5 is a block diagram showing steps in an example fabrication method for a voltage-isolated integrated circuit package with backside transformer, in accordance with the present disclosure.

FIG. 5 is a block diagram showing steps in an example fabrication method 500 for a voltage-isolated (galvanically-isolated) integrated circuit (chip) package with backside transformer, in accordance with the present disclosure. For method 500, a lead frame can be provided having first and second sides and configured to receive first and second semiconductor dies, as described at 502. First and second semiconductor dies can be connected to a first side of the lead frame, as described at 504.

Continuing with the description of method 500, a transformer (ferromagnetic) core can be disposed on (connected to) the second side of the lead frame, as described at 506. First and second coils can be disposed about the transformer core, with the coils and core configured as a transformer, as described at 508. In some examples, the transformer core and coils can be mounted on or implemented with a substrate, e.g., a PCB or alumina substrate, that is mounted to a lead frame. In some examples, one or more portions of the individual coils may be composed of or include conductive traces of the substrate. A package body can be formed covering the first and second semiconductor dies and the first and second coils disposed on the ferromagnetic coil, as described at 510.

In some embodiments, forming a package body (e.g., by step 510) can include a multi-step molding process. For example, first and second mold materials used for a package body may each be applied by a separate (mold) molding process/step, forming respective molded packages or molds, which together can form the package body. For example, a first mold (including dies and die paddles) of first mold material can be formed such that the die paddles are not exposed at the edge/boundary of first mold, with only conductive pads being exposed on the back side of the first mold for connection to the transformer included in second mold. When the two molds are brought into connection (mated), the transformer becomes electrically connected to the semiconductor dies in the first mold. The conductive pads may be selected/designed to have desired shapes and/or sizes, e.g., to facilitate attaining a particular separation distance. In some embodiments, conductive pads can be fabricated to have a desired size and shape by selective partial etching of a lead frame of the first mold.

Accordingly, embodiments of the inventive subject matter can afford various benefits relative to prior art techniques. For example, embodiments and examples of the present disclosure can enable or facilitate use of smaller size packages for a given power or voltage rating. Embodiments and examples of the present disclosure can enable or facilitate lower costs and higher scalability for manufacturing of IC packages/modules having voltage-isolated IC dies and transformers.

Various embodiments of the concepts, systems, devices, structures, and techniques sought to be protected are described above with reference to the related drawings. Alternative embodiments can be devised without departing from the scope of the concepts, systems, devices, structures, and techniques described. For example, while some examples are described herein as having transformer cores aligned in a direction normal to the epitaxial direction of a die (i.e., parallel to the substrate direction), other examples and embodiments may have a core aligned parallel to the epitaxial direction (i.e., normal to the substrate direction). For further example, while embodiments and examples are described herein as generally including two transformer windings (coils), examples and embodiments of the present disclosure may include a different number of transformer windings, including, but not limited to: one, three, four, five, etc.; moreover, the windings (coils) themselves may each have a whole number or fractional number of turns (loops about a related core or structure intended to receive a core), e.g., 1.5, 2.5, 1.75, 1.8, 2.25, etc.

It is noted that various connections and positional relationships (e.g., over, below, adjacent, etc.) may be used to describe elements and components in the description and drawings. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

As an example of an indirect positional relationship, positioning element “A” over element “B” can include situations in which one or more intermediate elements (e.g., element “C”) is between elements “A” and elements “B” as long as the relevant characteristics and functionalities of elements “A” and “B” are not substantially changed by the intermediate element(s).

Also, the following definitions and abbreviations are to be used for the interpretation of the claims and the specification. The terms “comprise,” “comprises,” “comprising,” “include,” “includes,” “including,” “has,” “having,” “contains” or “containing,” or any other variation are intended to cover a non-exclusive inclusion. For example, an apparatus, a method, a composition, a mixture, or an article, that includes a list of elements is not necessarily limited to only those elements but can include other elements not expressly listed or inherent to such apparatus, method, composition, mixture, or article.

Additionally, the term “exemplary” means “serving as an example, instance, or illustration. Any embodiment or design described as “exemplary” is not necessarily to be construed as preferred or advantageous over other embodiments or designs. The terms “one or more” and “at least one” indicate any integer number greater than or equal to one, i.e., one, two, three, four, etc. The term “plurality” indicates any integer number greater than one. The term “connection” can include an indirect “connection” and a direct “connection”.

References in the specification to “embodiments,” “one embodiment, “an embodiment,” “an example embodiment,” “an example,” “an instance,” “an aspect,” etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

Relative or positional terms including, but not limited to, the terms “upper,” “lower,” “right,” “left,” “vertical,” “horizontal, “top,” “bottom,” and derivatives of those terms relate to the described structures and methods as oriented in the drawing figures. The terms “overlying,” “atop,” “on top, “positioned on” or “positioned atop” mean that a first element, such as a first structure, is present on a second element, such as a second structure, where intervening elements such as an interface structure can be present between the first element and the second element. The term “direct contact” means that a first element, such as a first structure, and a second element, such as a second structure, are connected without any intermediary elements.

Use of ordinal terms such as “first,” “second,” “third,” etc., in the claims to modify a claim element does not by itself connote any priority, precedence, or order of one claim element over another, or a temporal order in which acts of a method are performed, but are used merely as labels to distinguish one claim element having a certain name from another element having a same name (but for use of the ordinal term) to distinguish the claim elements.

The terms “approximately” and “about” may be used to mean within ±20% of a target (or nominal) value in some embodiments, within plus or minus (±) 10% of a target value in some embodiments, within ±5% of a target value in some embodiments, and yet within ±2% of a target value in some embodiments. The terms “approximately” and “about” may include the target value. The term “substantially equal” may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The disclosed subject matter is not limited in its application to the details of construction and to the arrangements of the components set forth in the following description or illustrated in the drawings. The disclosed subject matter is capable of other embodiments and of being practiced and carried out in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions as far as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the spirit and scope of the following claims.

All publications and references cited in this patent are expressly incorporated by reference in their entirety.

What is claimed is:

1. A chip package for a galvanically isolated integrated circuits (ICs), the chip package comprising:
- a lead frame with first and second sides;
- first and second semiconductor dies disposed on the first side of the lead frame, wherein the first semiconductor die is electrically coupled to a first electrically conductive portion of the lead frame on the first side of the lead frame, and wherein the second semiconductor die is electrically coupled to a second electrically conductive portion of the lead frame on the first side of the lead frame;
- a molding material configured to cover a portion of the lead frame and forming a package body;
- a ferromagnetic core disposed in the package body adjacent the second side of the lead frame; and
- first and second coils disposed in the package body about the ferromagnetic core in a transformer configuration, each coil including a plurality of windings;
- wherein the first and second coils and ferromagnetic core are disposed within the package body on the second side of the lead frame, opposite to the first side, wherein the first coil is electrically coupled to the first electrically conductive portion of the lead frame on the second side of the lead frame, and wherein the second coil is electrically coupled to the second electrically conductive portion of the lead frame on the second side of the lead frame.

2. The chip package of claim 1, further comprising first and second die pads, wherein the first and second semiconductor dies are disposed on first and second die pads, respectively.

3. The chip package of claim 2, wherein the first and/or second die comprises an integrated circuit.

4. The chip package of claim 3, wherein the integrated circuit comprises a gate driver circuit.

5. The chip package of claim 1, further comprising an insulator material disposed between the first and second coils.

6. A chip package comprising:
- a lead frame having first and second sides and configured to receive first and second semiconductor dies on the first side;
- a package body including molding material and configured to cover a portion the lead frame;
- a transformer core disposed in the package body on the second side of the lead frame; and
- first and second coils having windings disposed about the transformer core in a transformer configuration and disposed in the package body;
- wherein the first and second coils and transformer core are disposed on the second side of the lead frame, opposite to the first side.

7. The chip package of claim 6, further comprising first and second semiconductor dies disposed on the first side of the lead frame.

8. The chip package of claim 7, wherein the first and second coils are configured to magnetically couple the first and second semiconductor dies.

9. The chip package of claim 8, wherein the first and second semiconductor dies comprise first and second integrated circuits, respectively.

10. The chip package of claim 9, wherein the first or second integrated circuit comprises a gate driver.

11. The chip package of claim 10, wherein the gate driver is configured to receive power from the transformer.

12. The chip package of claim 10, wherein the gate driver is configured to receive control signals from the transformer.

13. The chip package of claim 9, wherein the first or second integrated circuit comprises a gate driver.

14. The chip package of claim 7, further comprising first and second die pads disposed on the first side of the lead frame and configured to receive the first and second semiconductor dies, respectively.

15. The chip package of claim 6, wherein the lead frame comprises a partially etched lead frame.

16. The chip package of claim 6, wherein a shortest distance between the lead frame and a conductive portion of the transformer is at least 1 mm.

17. The chip package of claim 6, wherein a shortest distance between the lead frame and a conductive portion of the transformer is at least 1.2 mm.

18. The chip package of claim 6, wherein a shortest distance between first and second conductive portions of the lead frame is at least 1.5 mm.

19. The chip package of claim 6, wherein a shortest distance between first and second conductive portions of the lead frame is at least 3 mm.

20. The chip package of claim 6, wherein a shortest distance between first and second conductive portions of the lead frame is at least 5.5 mm.

21. The chip package of claim 6, wherein a shortest distance between first and second conductive portions of the lead frame is at least 7.2 mm.

22. The chip package of claim 6, wherein a shortest distance between first and second conductive portions of the lead frame is at least 8 mm.

23. The chip package of claim 7, further comprising a first plurality of wire bonds connecting the lead frame to the first semiconductor die.

24. The chip package of claim 23, further comprising a second plurality of wire bonds connecting the lead frame to the second semiconductor die.

25. The chip package of claim 24, wherein a shortest distance between the first and second pluralities of wire bonds is at least 1 mm.

26. The chip package of claim 24, wherein a shortest distance between the first and second pluralities of wire bonds is at least 1.2 mm.

27. The chip package of claim 24, wherein a shortest distance between the first and second pluralities of wire bonds is at least 1.5 mm.

28. The chip package of claim 24, wherein a shortest distance between the first and second pluralities of wire bonds is at least 3 mm.

29. The chip package of claim 24, wherein a shortest distance between the first and second pluralities of wire bonds is at least 5.5 mm.

30. The chip package of claim 24, wherein a shortest distance between the first and second pluralities of wire bonds is at least 7.2 mm.

31. The chip package of claim 24, wherein a shortest distance between the first and second pluralities of wire bonds is at least 8 mm.

32. The chip package of claim 1, wherein the first and second coils are on opposite sides of an axis equidistant between the first and second die and extending from opposite sides of the lead frame.

* * * * *